(12) United States Patent
Ekkels et al.

(10) Patent No.: US 10,186,447 B2
(45) Date of Patent: Jan. 22, 2019

(54) METHOD FOR BONDING THIN SEMICONDUCTOR CHIPS TO A SUBSTRATE

(71) Applicants: IMEC VZW, Leuven (BE); Universiteit Gent, Ghent (BE)

(72) Inventors: Philip Ekkels, St. Laureins (BE); Tom Sterken, Merelbeke (BE)

(73) Assignees: IMEC VZW, Leuven (BE); Universiteit Gent, Ghent (BE)

( * ) Notice: Subject to any disclaimer, the term of this patent is extended or adjusted under 35 U.S.C. 154(b) by 0 days.

(21) Appl. No.: 15/800,571

(22) Filed: Nov. 1, 2017

(65) Prior Publication Data

US 2018/0158712 A1 Jun. 7, 2018

(30) Foreign Application Priority Data

Dec. 6, 2016 (EP) .................................. 16202334

(51) Int. Cl.
| | |
|---|---|
| H01L 21/00 | (2006.01) |
| H01L 21/683 | (2006.01) |
| H01L 21/78 | (2006.01) |
| H01L 21/56 | (2006.01) |

(52) U.S. Cl.
CPC ........ *H01L 21/6836* (2013.01); *H01L 21/561* (2013.01); *H01L 21/6835* (2013.01); *H01L 21/78* (2013.01); *H01L 2221/68327* (2013.01); *H01L 2221/68368* (2013.01); *H01L 2221/68386* (2013.01)

(58) Field of Classification Search
CPC . H01L 2224/97; H01L 21/6836; H01L 21/78; H01L 21/7806; H01L 21/56
See application file for complete search history.

(56) References Cited

U.S. PATENT DOCUMENTS

| | | | |
|---|---|---|---|
| 7,232,740 B1 | 6/2007 | Mountain | |
| 2003/0111713 A1* | 6/2003 | Cheng | H01L 21/56 257/668 |

(Continued)

FOREIGN PATENT DOCUMENTS

JP 2003-332267 A 11/2003

OTHER PUBLICATIONS

European Search Report, European Patent Application No. 16202334.5 dated May 29, 2017, 9 pages.

*Primary Examiner* — Jaehwan Oh
*Assistant Examiner* — John M Parker
(74) *Attorney, Agent, or Firm* — McDonnell Boehnen Hulbert & Berghoff LLP

(57) ABSTRACT

A method for bonding thin chips to a target substrate is described herein. According to an example method, an adhesive tape is provided with thinned chips attached thereto. The chips are transferred to a carrier substrate by one or more tape-to-tape transfer steps. The carrier is then diced into separate carrier-and-chip assemblies, which can be handled by existing tools designed for handling chips of regular thickness. The fact that the thinning step is separate from the carrier attachment may lead to reduced thickness variation of the chips. The use of tape-to-tape transfer steps allows for attaching either the front or the back side of the chips to the carrier. The use of an individual carrier per chip allows for treating the thinned chip as if it were a standard chip.

20 Claims, 3 Drawing Sheets

(56) References Cited

U.S. PATENT DOCUMENTS

| | | |
|---|---|---|
| 2005/0176171 A1* | 8/2005 | Miyaki ................. H01L 21/561 438/106 |
| 2006/0264006 A1* | 11/2006 | Kian .................... H01L 21/3043 438/464 |
| 2008/0003780 A1 | 1/2008 | Sun et al. |
| 2008/0060750 A1* | 3/2008 | Wang .................... G06K 19/077 156/238 |
| 2008/0242052 A1 | 10/2008 | Feng |
| 2010/0035405 A1 | 2/2010 | Chou et al. |
| 2010/0112782 A1 | 5/2010 | Teixeira |
| 2013/0005088 A1 | 1/2013 | Han et al. |
| 2013/0273691 A1 | 10/2013 | Pascual et al. |

\* cited by examiner

METHOD FOR BONDING THIN SEMICONDUCTOR CHIPS TO A SUBSTRATE

CROSS-REFERENCE TO RELATED APPLICATIONS

The present application is a non-provisional patent application claiming priority to EP Patent Application No. 16202334.5, filed Dec. 6, 2016, the contents of which are hereby incorporated by reference.

FIELD OF THE DISCLOSURE

The present disclosure is related to the bonding of thin semiconductor chips to a target substrate.

BACKGROUND

The use of very thin microchips has gained importance in the development of flexible electronics and the integration of chips in printed circuit boards. Ultra-Thin Chip Packaging (UTCP) technology is one example of newly developed technologies which include fabrication and integration methods of these thin chips. Other technologies which benefit from these thin chip technologies are for example micro-LED displays or high-density electronics. Regardless of the application, the thin chips are manipulated in a plurality of process steps, including the bonding of the chips to a larger substrate. When microchips are thinned down to ultra-low thickness (<50 micron) they become flexible and relatively fragile and are hard to manipulate using regular (vacuum-based) equipment used in microfabrication. A reliable approach for handling these thin chips is to attach them to a thick holder, carrier (carrier substrate), or carrier chip using a temporary adhesive. This way these thin chips can be handled as if they were microchips of conventional thickness and without special equipment being required.

A conventional way of getting the thin chips attached to a carrier or holder is by attaching a substrate with microchips to a carrier substrate provided with a film of temporary adhesive and subsequently, after attachment, thin down the microchips. This approach, however, has several drawbacks. For example, it is desired to have a low total thickness variation (TTV) of the thinned microchips population. However, when the microchips substrate is thinned while being bonded to a carrier substrate, the TTV of the carrier substrate adds up to the TTV of the temporary adhesive and the TTV of the thinning process, thus resulting in an increased final TTV of the thinned microchips population.

Thinning of chips while the chips are supported on an auxiliary substrate followed by the transfer of the thinned chips to a stiff carrier has also been described, for example, in U.S. Patent Application Pub. No. 2008/003780. In this document, however, the transfer of the chips to the carrier involves the bonding of the carrier directly to the thinned side of the chips while the chips are attached to the auxiliary substrate. This method allows only a single orientation of the chips with respect to the carrier, commonly called "face-up orientation."

SUMMARY

The disclosure is related to a method for bonding thin chips (e.g., ultrathin chips used in an Ultra-Thin Chip Packaging (UTCP) process) to a target substrate. According to an example embodiment of the present disclosure, an adhesive tape is provided with thinned chips attached thereto. The chips are transferred to a carrier substrate by one or more tape-to-tape or tape-to-carrier transfer steps. Then the carrier is diced into separate carrier/chip assemblies which can be handled by existing tools designed for handling chips of regular or standard thickness. In an example, a regular or standard thickness is between 200 to 800 microns for silicon substrates of various diameters. The fact that the thinning is separate from the carrier attachment helps lead to reduced thickness variation of the chips. Further, the use of tape-to-tape transfer steps allows for attaching either the front or the back side of the chips to the carrier.

In an example embodiment, the method for bonding thinned semiconductor chips to a target substrate comprises the steps of:

obtaining a first adhesive tape with a plurality of thinned semiconductor chips attached thereto, wherein the chips have a given position relative to each other;

transferring the thinned chips to a second adhesive tape by one or more tape-to-tape transfer steps, wherein the position of the chips relative to each other is maintained;

providing a carrier substrate having a temporary adhesive layer on its surface;

while the chips remain attached to the second tape, bonding the chips to the carrier substrate by attaching the chips to the adhesive layer;

peeling off the second adhesive tape, thereby obtaining an assembly of the carrier substrate and the thinned chips attached thereto by the temporary adhesive;

dicing the assembly, to thereby obtain a plurality of carrier/chip assemblies, each carrier/chip assembly comprising a carrier chip and a thin chip removably attached thereto;

bonding the carrier/chip assemblies to the target substrate, wherein the chips are bonded to a surface of the target substrate; and removing the carrier chips.

According to an embodiment, the front side of the chips is attached to the first adhesive tape. According to an embodiment, the back side of the chips is attached to the second tape, so that the front side of the chips is attached to the adhesive layer. According to an embodiment, the chips are separate from each other when they are attached to the first adhesive tape. According to another embodiment, the chips are part of a uniform thinned substrate when they are attached to the first adhesive tape.

The second tape may be a polyimide film tape, such as Kapton® tape. In an example, the thickness of the thinned chips is on the order of tens of micrometers (e.g., within an inclusive range between 10 and 100 micrometers). In a more particular example, the thickness may be lower than 50 μm.

According to an embodiment, the thinned chips are suitable for use in UTCP technology. According to an embodiment, the thinned chips are bonded to the target substrate by adhesive bonding, and a thermosetting adhesive is produced on the backside of the chips when the chips are attached to the carrier substrate, before dicing the assembly of the carrier and the thinned chips. The carrier substrate may be a glass substrate.

The method of the disclosure may further comprise the following steps for producing the plurality of thinned semiconductor chips attached to a first adhesive tape: producing a plurality of semiconductor chips on a semiconductor wafer, the chips being uniform with the wafer; and while the chips remain uniform with the wafer, attaching the front side of the chips to a first adhesive tape, and thinning the wafer from the backside, to thereby reduce the thickness of the chips to a predefined thickness.

In an example embodiment, the chips may be separated laterally from each other prior to the step of attaching the chips to the first adhesive tape, wherein the step of thinning the wafer from the backside is continued until the chips are separated and obtain the predefined thickness.

BRIEF DESCRIPTION OF THE FIGURES

The above, as well as additional, features will be better understood through the following illustrative and non-limiting detailed description of example embodiments, with reference to the appended drawings. Like reference numerals refer to like elements in the various figures.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1A:
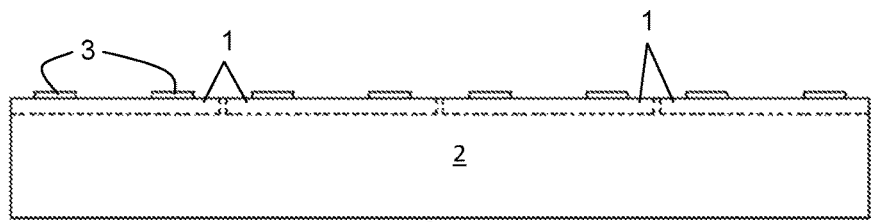
FIGS. 1a-1m show an example sequence of process steps of an example method, according to an example embodiment.

An example embodiment of the method according to the present disclosure starts from an adhesive tape with a plurality of thinned chips, which are each attached to the adhesive tape. The chips have a particular position relative to each other. FIGS. 1a to 1d illustrate an example method for producing such an adhesive tape with chips attached thereto. Referring to FIG. 1a, a plurality of chips 1 are produced on a semiconductor wafer 2 in accordance with a production process (see FIG. 1a) involving front end of line and back end of line processing. The chips 1 may be chips suitable for use in Ultra-Thin Chip Packaging (UTCP) technology. The chips have an active front side facing upwards, and symbolized by the presence of a plurality of contacts 3 on the active side. The chips are uniform with the wafer (i.e., the thickness of the chips is undefined at this point) and the dotted lines in FIG. 1a merely indicate the lateral boundaries of the chips and the thickness to which the chips will be thinned later in the process.

Figure 1B:
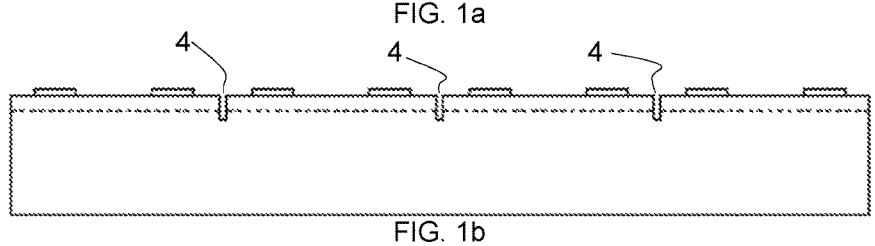
Figure 1C:
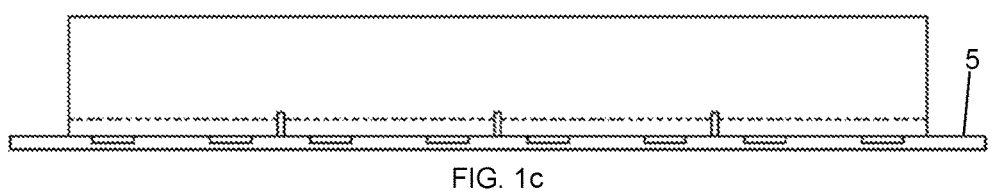
Figure 1D:
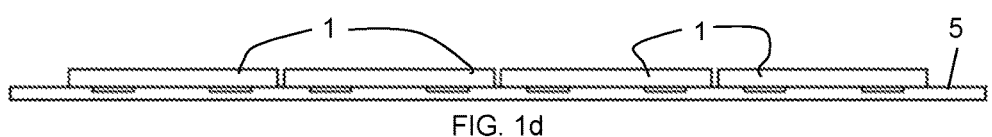

In the next step, the chips are separated laterally from each other by a dicing operation (see FIG. 1b). As shown in the drawing, the dicing is performed by sawing grooves 4 down to a given depth that exceeds the final desired thickness of the chips 1. The wafer 2 is then attached to an adhesive tape 5 (see FIG. 1c) with the front side of the chips attached to the tape. The word "tape" is used in the present specification, but could be replaced by "foil." Both terms refer to a continuous flexible sheet whose surface area covers the totality of the substrate to which it is attached. With the tape 5 supported by a flat support surface (not shown), a thinning step is then performed on the wafer's back side (e.g., by grinding the wafer material). This thinning continues until reaching the previously created dicing grooves 4, and further until the desired chip thickness is reached. In an example, the desired chip thickness is about 30 μm; however, other examples of desired chip thickness are possible as well. The result is an array of thin chips 1 attached to the adhesive tape 5 (see FIG. 1d). The process steps described so far are known as a "dicing before grinding" process, and may be performed in accordance with process parameters and using tools known in the art or later developed for performing this process.

Figure 1E:
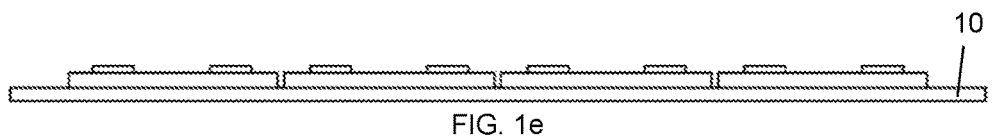

According to the method of the disclosure, the chips are then transferred to a second adhesive tape 10 (see FIG. 1e), with the back side of the chips 1 attached to the second tape and with the relative position of the chips with respect to each other being maintained. This is done by one or more tape-to-tape transfer steps, known as such in the art. When one single tape-to-tape transfer takes place, the second tape 10 is laminated on the backside of the chips 1, after which the first tape 5 is peeled off from the chips' front side. The second tape 10 may be a Kapton® tape which can resist high process temperatures used further in the process. In some examples, it may be required to do several tape-to-tape transfers, in cases where the first and second adhesive tapes have properties which make it impossible or difficult to transfer the chips directly from the first tape to the second, or where tape-to-tape transfer is required for other reasons such as reliable transport of the wafers to different locations, or where the backside of the chips needs to be exposed instead of the front side when the chips are attached to the second tape 10 (see FIG. 1e).

Figure 1F:
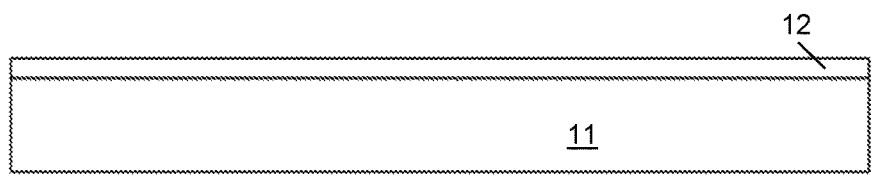
Figure 1G:
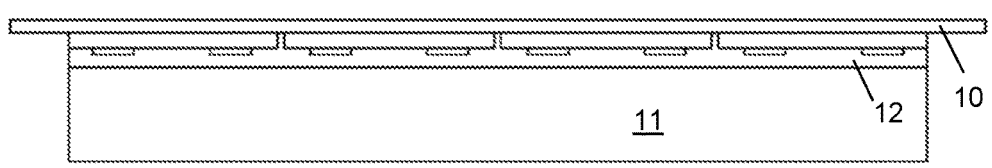

A carrier substrate 11 is then provided and placed horizontally. In an example embodiment, the carrier substrate 11 is a glass substrate. An adhesive layer 12 is provided on the upper surface of the carrier substrate (see FIG. 1f). Layer 12 is a temporary adhesive, i.e. an adhesive that establishes a bond that can be reversed (de-bonded) without damage, such as mechanical damage, to the bonded parts. In an example embodiment, the adhesive layer is a thermoplastic layer that needs a high temperature to bond, a strong bond being established when the temperature drops, so that the bond can be undone by again raising the temperature. However, other types of temporary adhesives may be applied. The second tape 10 with the chips attached thereto is flipped and bonded to the adhesive layer 12 (see FIG. 1g). This step may be performed in a membrane bonder under the high temperature required for the adhesive layer 12 to bond the chips. During bonding, the chips 1 are attached to the adhesive layer 12 while the backside of the chips is protected from adhesive contamination by the second tape 10. The chips are shown on the drawing as being fully embedded in the adhesive layer 12. However, this may not be the case for example embodiments of the disclosure. For instance, in other examples, the chips may be on top of the adhesive layer 12 or partly embedded therein.

Figure 1H:
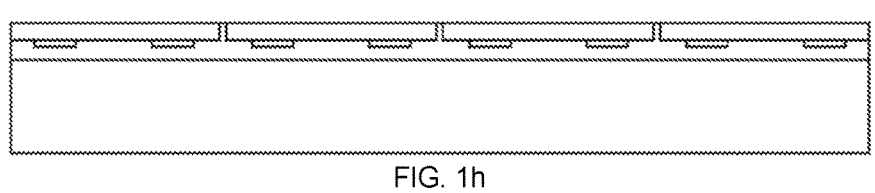
Figure 1I:
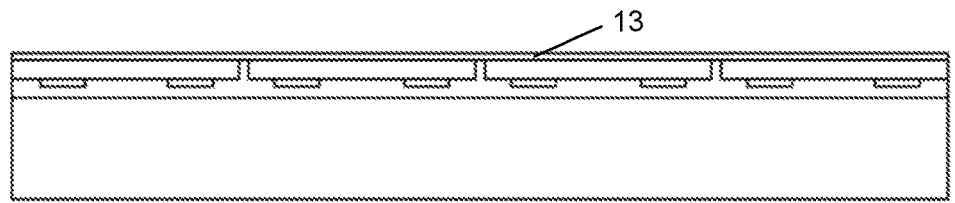
Figure 1J:
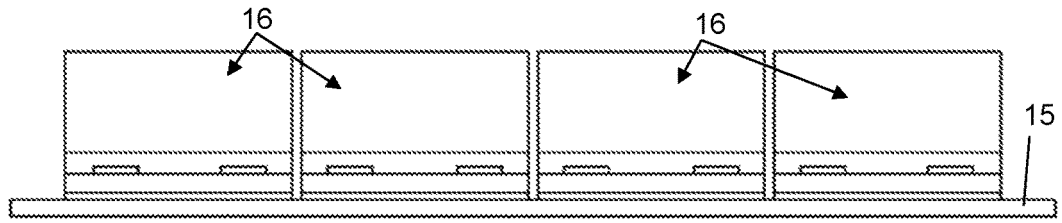
Figure 1K:
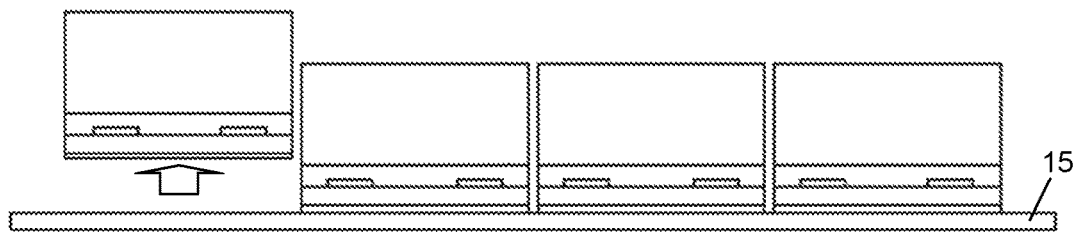

The second tape 10 is then peeled off (see FIG. 1h). In example embodiments, this peeling is followed by a plasma cleaning step to remove any remains of the tape's adhesive. When the chips 1 are UTCP chips, an example next step is the deposition of a thermosetting adhesive layer 13 on the backside of the chips (see FIG. 1i). This may be a Benzocyclobutene (BCB) layer for example, applied by spinning BCB on the backside of the chips. The following step is the placement of the carrier 11 with the chips side (BCB side in the case of UTCP chips) on a dicing tape 15, and the dicing of the carrier wafer into separate carrier/chip (holder/chip) assemblies 16 (see FIG. 1j) which can be picked up from the dicing tape (see FIG. 1k). In the embodiment of FIG. 1, each assembly comprises a carrier chip 2', a thin microchip 1, a piece of the temporary adhesive 12 and a piece of the thermosetting adhesive 13. The carrier/chip assemblies 16 can be handled further as chips of a normal thickness in a bonding process for bonding the thin chips to a target wafer.

Figure 1L:
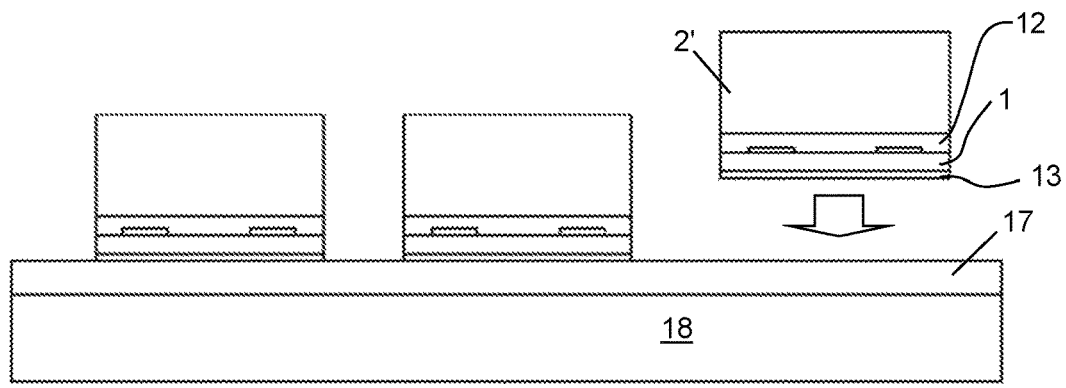
Figure 1M:
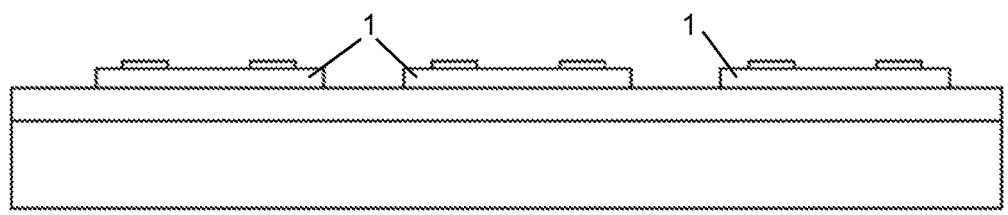

FIG. 1*l* shows for example the bonding of UTCP chips by adhesive bonding to a polyimide layer 17 provided on the target substrate 18, the adhesive bond being established by heating to a temperature at which the BCB layer 13 acquires its adhesive properties. After bonding the chips in this way, the carrier chips are then removed (see FIG. 1*m*). If the adhesive layer 12 is a thermoplastic layer, this may be done by heating the wafer with the holder/chip assemblies (carrier/chip assemblies) bonded thereto to a temperature at which this adhesive layer 12 softens, so that the holders (carrier chips 2') can be removed by sliding the holders away from the bonded chips. In an example embodiment, the temperature at which the thermoplastic layer 12 softens is sufficiently above the thermosetting temperature of the BCB to ensure that the holders remain attached to the chips while the BCB-bond is taking place. After the holders (carrier chips) have been removed, a cleaning step may be applied before continuing the process.

In an example embodiment, the chips are not thinned on the carrier wafer 11 itself but in a separate thinning step, such as the dicing before grinding sequence. In an example, the total thickness variation across the chip population is determined only by this thinning step. As the thinning step may be performed under well-defined conditions (for example, the wafer may be supported during thinning on a surface with very low TTV), the TTV of the chip population can be minimized. Therefore, any thickness variation on the carrier substrate 11 is not transferred to the carrier/chip assemblies 16. This makes it possible to use carrier substrates 11 with lower requirements in terms of TTV compared to the conventional method of thinning the chips on the carrier. Also, the requirements on the uniformity of the temporary adhesive film 12 are much reduced, resulting in a bigger process window. Furthermore, the tape-to-tape transfer step allows the attachment of the chips 1 to the carrier 11 with their active side facing downward (i.e. toward the carrier), as is required in particular process sequences such as the UTCP process. The method is however not limited to the latter feature. By applying an additional tape-to-tape transfer before transferring the chips to the second tape 10, it is possible to attach the chips with their back side to the adhesive layer 12. What counts is that the use of the tape-to-tape transfer(s) makes it possible in a straightforward way to attach either the front or the back side of the chips to the adhesive layer 12, as required by the type of chips for example.

Figure 2A:
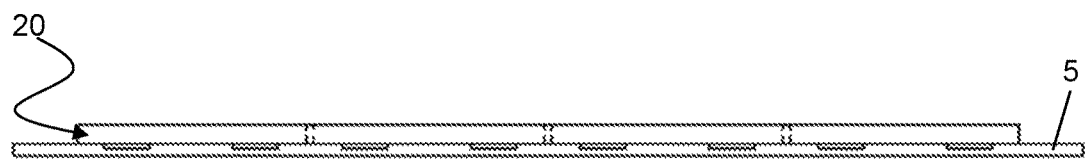
FIGS. 2a-2d illustrate example steps according to another example method, according to an example embodiment.
Figure 2B:
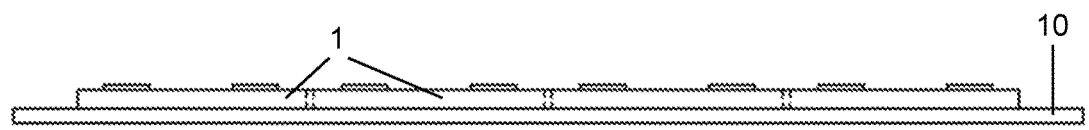
Figure 2C:
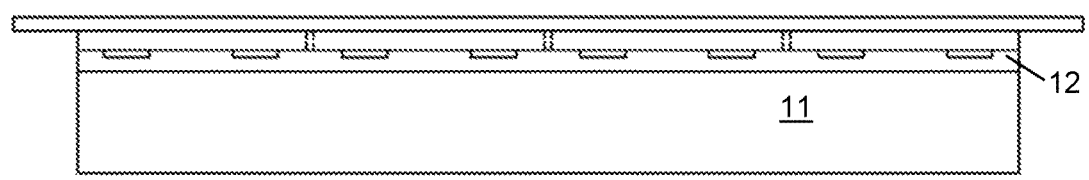
Figure 2D:
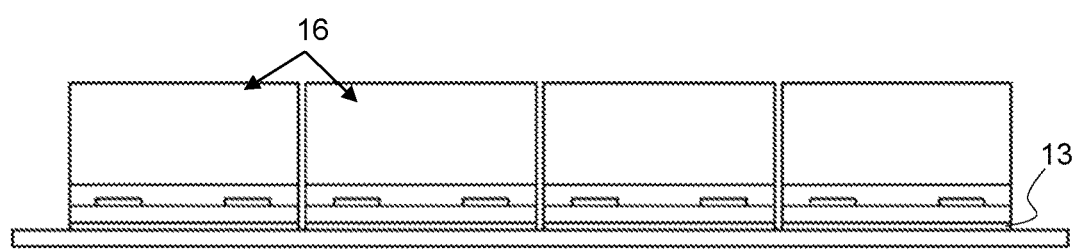

In an alternative embodiment, the wafer is thinned on the first tape 5 but without previously dicing the wafer (see FIG. 2*a*). The thinned wafer 20 comprising non-separated thin chips 1 (i.e. a uniform thinned substrate) is then transferred entirely to the second tape 10 (see FIG. 2*b*) after which is it bonded to the carrier 11 via the temporary adhesive 12 (see FIG. 2*c*). The dicing of the carrier to form separate carrier/chip assemblies 16 then includes dicing of the chips into separate chips (see FIG. 2*d*), possibly after deposition of a thermosetting adhesive 13 on the entire thinned wafer surface.

According to an example embodiment, the steps illustrated in FIGS. 1*a* to 1*d* and FIGS. 2*a* and 2*b* (or any steps that result in the same end-product) produce the starting point for the method of the disclosure, but are themselves not included in the method of the disclosure. On the other hand, according to another example embodiment, the steps illustrated in FIGS. 1*a* to 1*d* and FIGS. 2*a* and 2*b* (or any steps resulting in the same end product) are part of the method of the disclosure. In other words, the steps for producing the first adhesive tape 5 with thinned chips attached thereto (already separated or not) may or may not be included in embodiments of the method of the disclosure. The disclosure is not limited to the methods described above for producing a thinned wafer on the first adhesive tape 5. In an example embodiment, thinning of the wafer is done over the complete surface of the wafer, but may also be limited to a portion of the surface, e.g. on a central part of the wafer. Also, the wafer 2 is not necessarily thinned while already attached to the tape 5. The wafer may first be releasably attached to a rigid auxiliary substrate and thinned while attached to the substrate until the chips are thinned and (if dicing was done before thinning) separated, after which the chips are transferred to the tape 5 whilst maintaining their position relative to each other. The disclosure is not limited to the use of full wafers. It may be applied for a wide variety of substrates and for a wide variety of substrate sizes, including for example parts of a wafer.

While some embodiments have been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used. Any reference signs in the claims should not be construed as limiting the scope.

What is claimed is:

1. A method for bonding thinned semiconductor chips to a target substrate, the method comprising:
   obtaining a first adhesive tape with a plurality of thinned semiconductor chips attached thereto, wherein the thinned semiconductor chips have a given position relative to each other;
   transferring the thinned semiconductor chips to a second adhesive tape by one or more tape-to-tape transfer steps, wherein the given position relative to each other is maintained;
   providing a carrier substrate having a temporary adhesive layer on a surface;
   while the thinned semiconductor chips remain attached to the second adhesive tape, bonding the thinned semiconductor chips to the carrier substrate by attaching the thinned semiconductor chips to the temporary adhesive layer;
   peeling off the second adhesive tape, thereby obtaining an assembly of the carrier substrate and the thinned semiconductor chips attached thereto by the temporary adhesive layer;
   dicing the assembly, to thereby obtain a plurality of carrier-and-chip assemblies, each carrier-and-chip assembly comprising a carrier chip and a thin chip removably attached thereto;
   bonding the carrier-and-chip assemblies to the target substrate, wherein the thinned semiconductor chips are bonded to a surface of the target substrate; and
   removing the carrier chips.

2. The method according to claim 1, wherein a front side of the thinned semiconductor chips is attached to the first adhesive tape.

3. The method according to claim 1, wherein a back side of the thinned semiconductor chips is attached to the second adhesive tape, so that a front side of the thinned semiconductor chips is attached to the temporary adhesive layer.

4. The method according to claim 1, wherein thinned semiconductor chips are separate from each other when they are attached to the first adhesive tape.

5. The method according to claim 1, wherein the thinned semiconductor chips are part of a uniform thinned substrate when they are attached to the first adhesive tape.

6. The method according to claim 1, wherein the second adhesive tape is a polyimide film tape.

7. The method according to claim 1, wherein a thickness of the thinned semiconductor chips is within an inclusive range between 10 to 100 micrometers.

8. The method according to claim 7, wherein the thickness of the thinned semiconductor chips is lower than 50 micrometers.

9. The method according to claim 7, wherein the thinned semiconductor chips are suitable for use in Ultra-Thin Chip Packaging (UTCP) technology.

10. The method according to claim 1, wherein the thinned semiconductor chips are bonded to the target substrate by adhesive bonding, and wherein a thermosetting adhesive is produced on a back side of the thinned semiconductor chips when the thinned semiconductor chips are attached to the carrier substrate, before dicing the assembly of the carrier substrate and the thinned semiconductor chips.

11. The method according to claim 1, wherein the carrier substrate is a glass substrate.

12. The method according to claim 1, the method further comprising producing the plurality of thinned semiconductor chips attached to a first adhesive tape, wherein producing the plurality of thinned semiconductor chips attached to the first adhesive tape comprises:
    producing a plurality of semiconductor chips on a semiconductor wafer, the semiconductor chips being uniform with the wafer; and
    while the semiconductor chips remain uniform with the wafer, attaching a front side of the semiconductor chips to the first adhesive tape, and thinning the wafer from a back side, to thereby reduce a thickness of the semiconductor chips to a predefined thickness.

13. The method according to claim 12, wherein the semiconductor chips are separated laterally from each other prior to the step of attaching the semiconductor chips to the first adhesive tape, and wherein the step of thinning the wafer from the back side is continued until the semiconductor chips are separated and obtain the predefined thickness.

14. A method for bonding thinned semiconductor chips to a target substrate, the method comprising:
    producing a plurality of semiconductor chips on a semiconductor wafer, the semiconductor chips being uniform with the wafer;
    while the semiconductor chips remain uniform with the wafer, attaching a front side of the semiconductor chips to a first adhesive tape, and thinning the wafer from a back side to reduce a thickness of the semiconductor chips, so as to obtain a plurality of thinned semiconductor chips that have a given position relative to each other;
    transferring the thinned semiconductor chips to a second adhesive tape by one or more tape-to-tape transfer steps, wherein the given position of the thinned semiconductor chips relative to each other is maintained;
    providing a carrier substrate having a temporary adhesive layer on a surface;
    while the thinned semiconductor chips remain attached to the second adhesive tape, bonding the thinned semiconductor chips to the carrier substrate by attaching the thinned semiconductor chips to the temporary adhesive layer;
    peeling off the second adhesive tape, thereby obtaining an assembly of the carrier substrate and the thinned semiconductor chips attached thereto by the temporary adhesive layer;
    dicing the assembly, to thereby obtain a plurality of carrier-and-chip assemblies, each carrier-and-chip assembly comprising a carrier chip and a thin chip removably attached thereto;
    bonding the carrier-and-chip assemblies to the target substrate, wherein the thinned semiconductor chips are bonded to a surface of the target substrate; and
    removing the carrier chips.

15. The method according to claim 14, wherein the second adhesive tape is a polyimide film tape.

16. The method according to claim 14, wherein a thickness of the thinned semiconductor chips is within an inclusive range between 10 and 100 micrometers.

17. The method according to claim 16, wherein the thickness of the thinned semiconductor chips is lower than 50 micrometers.

18. The method according to claim 17, wherein the thinned semiconductor chips are suitable for use in Ultra-Thin Chip Packaging (UTCP) technology.

19. The method according to claim 14, wherein the thinned semiconductor chips are bonded to the target substrate by adhesive bonding, and wherein a thermosetting adhesive is produced on the back side of the thinned semiconductor chips when the thinned semiconductor chips are attached to the carrier substrate, before dicing the assembly of the carrier substrate and the thinned semiconductor chips.

20. The method according to claim 14, wherein the carrier substrate is a glass substrate.

* * * * *